United States Patent
Sano et al.

(10) Patent No.: US 9,947,826 B2
(45) Date of Patent: Apr. 17, 2018

(54) ZNO-CONTAINING SEMICONDUCTOR STRUCTURE AND MANUFACTURING THEREOF

(71) Applicant: STANLEY ELECTRIC CO., LTD., Meguro-ku, Tokyo (JP)

(72) Inventors: Michihiro Sano, Odawara (JP); Yuka Sato, Hadano (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/288,827

(22) Filed: Oct. 7, 2016

(65) Prior Publication Data
US 2017/0104127 A1 Apr. 13, 2017

(30) Foreign Application Priority Data
Oct. 13, 2015 (JP) ................................. 2015-202153

(51) Int. Cl.
| | | |
|---|---|---|
| H01L 33/00 | (2010.01) | |
| H01L 33/28 | (2010.01) | |
| H01L 29/00 | (2006.01) | |

(52) U.S. Cl.
CPC .......... *H01L 33/0083* (2013.01); *H01L 29/00* (2013.01); *H01L 33/0012* (2013.01); *H01L 33/285* (2013.01)

(58) Field of Classification Search
CPC .................................................. H01L 25/0753
See application file for complete search history.

(56) References Cited

U.S. PATENT DOCUMENTS

| | | | |
|---|---|---|---|
| 2004/0155255 A1* | 8/2004 | Yamamoto | C30B 25/02 257/102 |
| 2013/0023709 A1* | 1/2013 | Cizeron | B01J 23/002 585/324 |
| 2014/0027766 A1* | 1/2014 | Saito | H01L 29/12 257/43 |

FOREIGN PATENT DOCUMENTS

| | | |
|---|---|---|
| JP | 2004221132 A | 8/2004 |
| JP | 2013211513 A | 10/2013 |

* cited by examiner

*Primary Examiner* — Thao P Le
(74) *Attorney, Agent, or Firm* — Holtz, Holtz & Volek PC

(57) ABSTRACT

A method of manufacturing ZnO-containing semiconductor structure includes steps of: (a) forming a subsidiary lamination, including alternately laminating at least two periods of active oxygen layers and ZnO-containing semiconductor layers doped with at least one species of group 3B element; (b) alternately laminating said subsidiary lamination and AgO layer, sandwiching an active oxygen layer, to form lamination structure; and (c) carrying out annealing in atmosphere in which active oxygen exists and pressure is below $10^{-2}$ Pa, intermittently irradiating oxygen radical beam on a surface of said lamination structure, forming a p-type ZnO-containing semiconductor structure co-doped with said group 3B element and Ag.

16 Claims, 14 Drawing Sheets

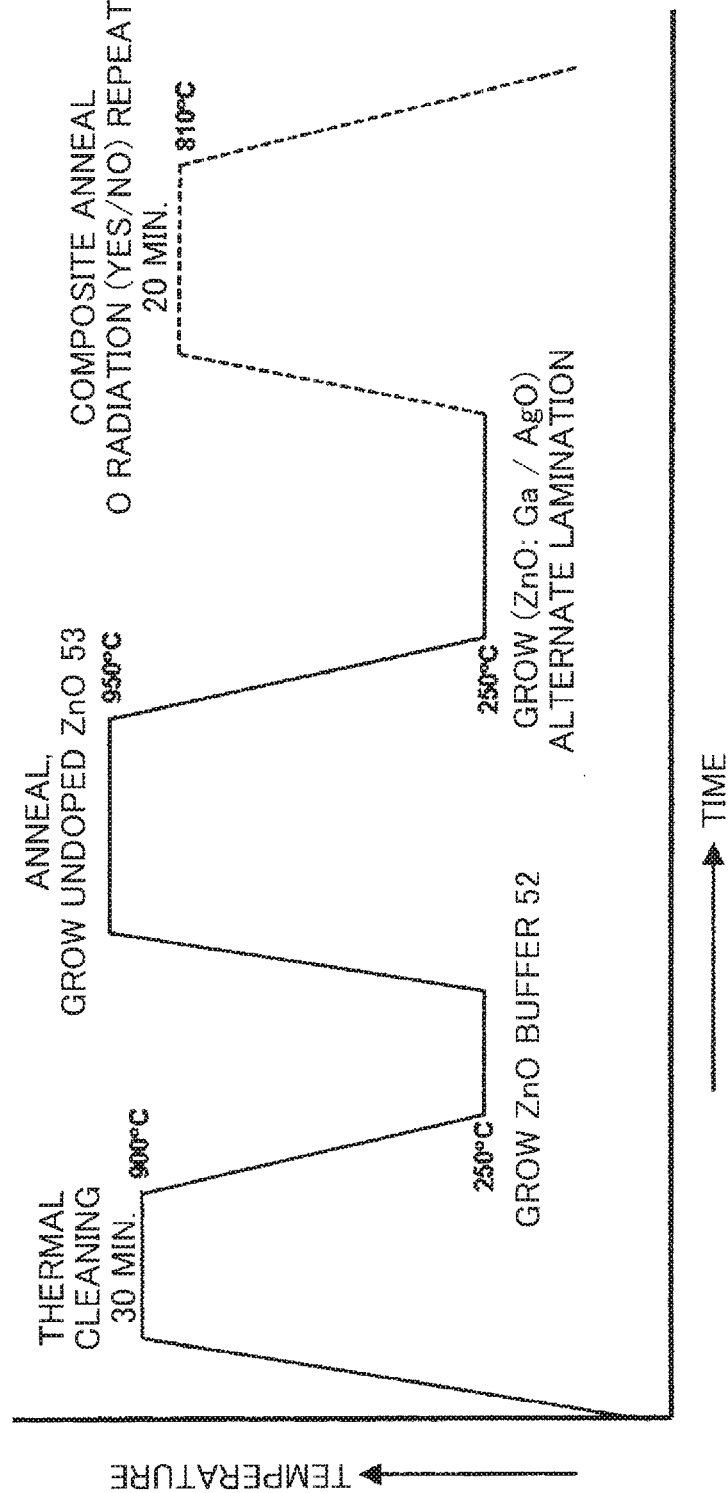

FIG. 8A
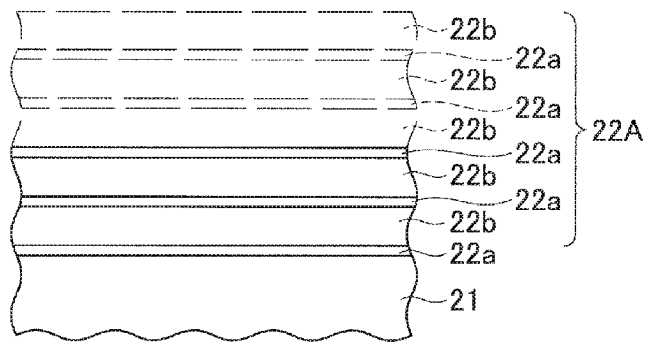
FIG. 8B
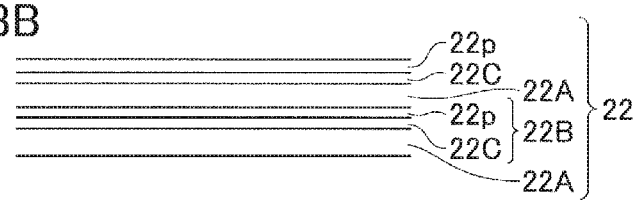
FIG. 8C
(O*/ZnO:Ga/O*/ZnO:Ga/O*/ZnO:Ga)/O*/AgO
5s/  3s  /5s/  3s  /5s/  3s  /5s/  25s
FIG. 8D
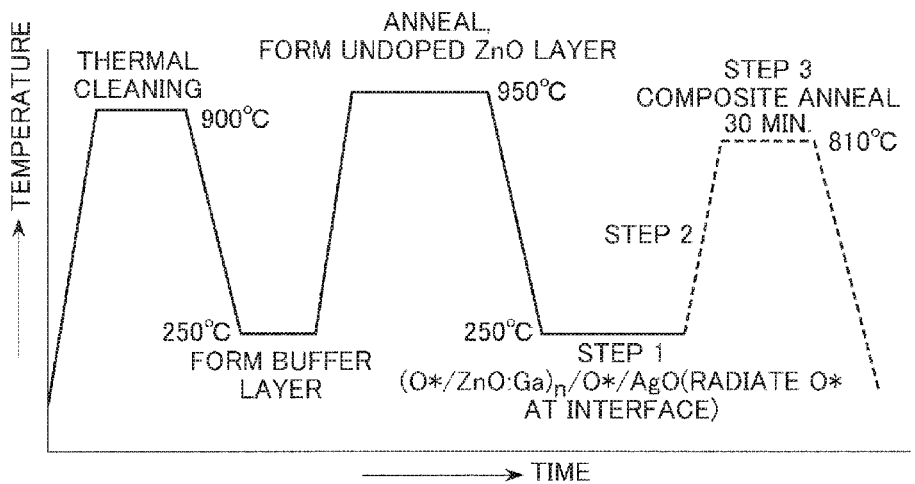

(S218GAO-an)  □50um

… (1)

ZNO-CONTAINING SEMICONDUCTOR STRUCTURE AND MANUFACTURING THEREOF

CROSS REFERENCE TO RELATED APPLICATION

This application is based on and claims priority on Japanese Patent Application No. 2015-202153, filed in Japan on Oct. 13, 2015, which is incorporated herein by reference.

FIELD OF THE INVENTION

This invention relates to ZnO-containing semiconductor structure and manufacture thereof.

DESCRIPTION OF THE RELATED ART

Zinc oxide (ZnO) is a direct transition type semiconductor having a band gap energy of 3.37 eV at the room temperature, and having a relatively large exciton binding energy of 60 meV. ZnO has such features that the cost of raw material is cheap, and that it has low bad affects to atmosphere and human beings. Therefore, realization of light emitting devices which use ZnO, and have high efficiency, low power dissipation and superior environmental effect, is expected.

Mixed crystal $Mg_xZn_{1-x}O$, in which MgO is added to ZnO, increases the band gap energy depending on composition x. $Mg_xZn_{1-x}O$ has characteristics similar to those of ZnO. $Mg_xZn_{1-x}O$ semiconductor will be called ZnO-containing semiconductor. It is possible to epitaxially grow ZnO-containing semiconductor layers on a substrate to form a light emitting device.

ZnO-containing semiconductor, however, has strong self-compensating effect ascribed to strong ionic property, and hence it is difficult to control p-type conductivity by the impurity doping method under thermal equilibrium as usual thermal diffusion. Researches are being done for developing p-type ZnO-containing semiconductor having practical performance, using, as acceptor impurities, group 5A elements such as N, P, As, Sb, group 1A elements such as Li, Na, K, and group 1B elements such as Cu, Ag, Au.

Techniques of forming a p-type ZnO-containing semiconductor layer by co-doping a p-type impurity and an n-type impurity are being studied. For example, technique of obtaining a p-type layer by co-doping acceptor such as Cu, Ag together with donor such as Ga, into a ZnO-containing semiconductor layer has been proposed (for example see JPA 2004-221132).

The inventors have proposed technique of growing alternate lamination structure in which $Mg_xZn_{1-x}O$ ($0 \leq x \leq 0.6$) layer doped for example with Ga, and layer containing Cu or Ag are alternately laminated, and annealing the alternate lamination structure, to realize a p-type $Mg_xZn_{1-x}O$ ($0 \leq x \leq 0.6$) layer (for example JPA 2013-211513, which is incorporated herein by reference).

SUMMARY

The electronic properties of p-type ZnO-containing semiconductor layer formed by co-doping acceptor impurity and donor impurity cannot be said to be sufficiently high yet. It is desired to realize a high quality p-type ZnO-containing semiconductor layer.

According to one aspect of the embodiment, there is provided a ZnO-containing semiconductor structure including ZnO-containing semiconductor co-doped with impurities including at least one species of group 3B element and Ag, wherein the ZnO-containing semiconductor generates in Raman scattering spectrum $A_1(LO)$ mode signal having an intensity lower than intensity of $E_2^{high}$ mode signal.

According to another aspect of the embodiment, there is provided a method for manufacturing a ZnO-containing semiconductor structure including the steps of: (a) forming a subsidiary lamination, including alternately laminating at least two periods of active oxygen layers and ZnO-containing semiconductor layers doped with at least one species of group 3B element, (b) alternately laminating the subsidiary lamination and AgO layer, sandwiching an active oxygen layer, to form lamination structure; and (c) carrying out annealing in atmosphere in which active oxygen exists and pressure is below $10^{-2}$ Pa, intermittently irradiating oxygen radical beam on a surface of the lamination structure, forming a p-type ZnO-containing semiconductor structure co-doped with the group 3B element and Ag.

BRIEF DESCRIPTION OF THE DRAWINGS

FIG. 2 is a graph illustrating temperature profile and content of process carried out at the timing, of the sample manufacturing process of the preceding research.

FIGS. 8A, 8B, 8C and 8D are a cross section of subsidiary lamination of ZnO-containing semiconductor according to embodiment, a cross section illustrating a lamination structure including the subsidiary lamination of FIG. 8A, representation of lamination structure including 3-division subsidiary lamination, and a graph illustrating temperature profile in sample manufacturing process according to the embodiment.

DESCRIPTION OF EMBODIMENTS

Figure 1A:
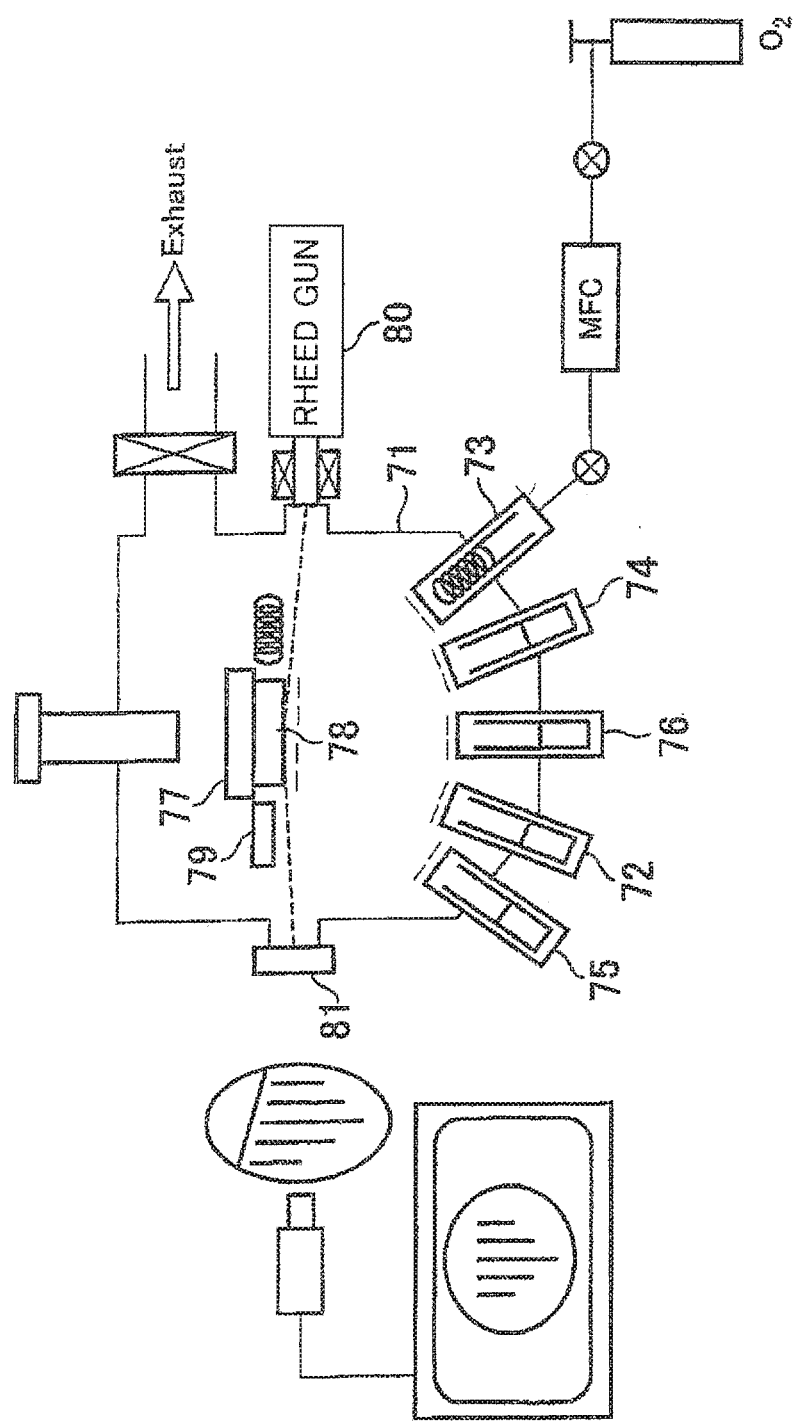
FIGS. 1A, 1B, and 1C are schematic cross sections of an MBE apparatus, a preceding research sample, and partial enlargement of the preceding research sample illustrating alternate lamination structure of Ga-doped ZnO layers and AgO layers.

In the preceding research made by the present inventors, technique of forming alternating lamination of Ga-doped ZnO-containing semiconductor layers and AgO layers by molecular beam epitaxy (MBE), and in-situ annealing the alternating lamination in an atmosphere in which active oxygen exists and pressure is below $10^{-2}$ Pa (for example, see JPA 2015-159269 which is incorporated herein by reference), thereby letting the alternating lamination to become p-type, has been investigated.

Preceding research made by the present inventors will first be described on the technique of forming alternating lamination of ZnO-containing semiconductor layers doped with group 3B element such as Ga and layers including p-type impurity Ag such as AgO, and converting it to p-type by annealing etc. Here, "layer" may have a thickness less than monoatomic layer. For example, some structure having a thickness corresponding to an average of 1/3 atomic layer may also be called layer. ZnO doped with Ga will be represented as ZnO:Ga.

In ZnO-containing semiconductor, Ag occupying Zn site can become acceptor functioning as p-type impurity. Even when a ZnO-containing layer co-doped with n-type impurity Ga and p-type impurity Ag is formed, it does not become p-type simply by it, and it becomes p-type only when it is annealed. For functioning Ag as p-type impurity, it is considered necessary to first move Ag to Zn vacancy by thermal diffusion etc. For example, it has been proposed to form a ZnO-containing semiconductor layer including n-type impurity Ga and p-type impurity Ag, and to anneal the ZnO-containing semiconductor layer in an atmosphere in which active oxygen exists and pressure is below $10^{-2}$ Pa, thereby converting the layer to p-type (JPA 2015-159269).

Atom of Ag has a large atomic diameter in ZnO-containing semiconductor, and hence it is difficult to consider that Ag freely moves in crystal lattice. For the movement of Ag, existence of lattice defects such as oxygen vacancies, etc. is desirable. It is considered that when a ZnO-containing crystal is heated and annealed, constituent atoms can be moved to generate lattice defects, and it will be possible to realize situation capable of moving Ag atoms. In controlling Ag movement, the inventors consider, based on the experimental results when vacuum atmosphere in which no oxygen exists is used, that atmosphere in which active oxygen exists is preferable.

When a Zn atom moves in the crystal, a Zn vacancy and an interstitial Zn atom will be generated. The Zn vacancy can capture Ag atom. The Zn vacancy is necessary component for letting Ag atom work as a p-type impurity. Together with the generation of Zn vacancy, an interstitial Zn atom is generated. The interstitial Zn atom works as donor. When a Zn atom moves, an O atom which looses the coupling partner will become easy to move. It is considered that where an O atom moves, an oxygen vacancy will be generated. The oxygen vacancy functions as a donor of low activation energy.

When there are many oxygen vacancies, it means that there are many donors which compensate acceptors. A high acceptor concentration will not be expected. Also, existence of many oxygen vacancies means existence of many lattice defects, which will lead to deterioration of crystal quality. It would be desirable to suppress quantity of oxygen vacancies in the crystal.

The inventors have considered to irradiate oxygen radicals on a surface of a ZnO-containing semiconductor layer, while heating and annealing the ZnO-containing semiconductor layer, to generate Zn vacancies. Oxygen atoms in heated ZnO-containing semiconductor layer become able to move. Thus, oxygen vacancies can be generated. Oxygen atoms having left lattice positions are capable of moving in the crystal. Oxygen atoms reaching a surface of the layer can evaporate from the surface into atmosphere. When oxygen radicals come from outside and are disposed onto a surface of a semiconductor layer, evaporation of oxygen atoms from the semiconductor layer into atmosphere may be suppressed. It can also be considered that oxygen atoms coming onto and attaching at a surface of the semiconductor layer may go into the semiconductor layer, and annihilate oxygen vacancies.

Effect of suppressing oxygen vacancies in the ZnO-containing semiconductor layer by radiation of active oxygen can be considered. Oxygen atoms attached on a surface will take vapor phase, and easily escape from the surface. If supply of oxygen radicals is stopped, effect of suppressing oxygen vacancies will vanish.

As a topic of the preceding research, discussion has been made on performing annealing while intermittently radiating or irradiating oxygen radicals on a surface of a ZnO-containing semiconductor layer co-doped with group 3B n-type impurity such as Ga and Ag which becomes p-type impurity, in an atmosphere in which active oxygen exists. In the period with no radiation of oxygen radicals, movement of Ag can occur together with generation and movement of oxygen vacancies. In the period with radiation of oxygen radicals, suppression and annihilation of oxygen vacancies can occur. Different phenomena can be generated in these two kinds of periods. Thus, annealing with intermittent radiation of oxygen radicals on a surface of ZnO-containing semiconductor layer will be called composite annealing.

Experiment has been performed in which ZnO-containing semiconductor layer co-doped with group 3B element such as Ga and Ag is formed, and composite annealing is performed in an atmosphere in which active oxygen exists and oxygen radical beam is intermittently radiated on the surface of the ZnO-containing semiconductor layer. Equipment and samples used in the experiment will be described hereinafter.

Growth of ZnO-containing semiconductor layer is done by molecular beam epitaxy (MBE). After growth of a semiconductor layer, composite annealing as stated above is done by in-situ annealing in the MBE apparatus.

FIG. 1A is a schematic cross sectional view illustrating MBE apparatus. The apparatus has a vacuum chamber 71, and a Zn source gun 72, an O source gun 73, a Mg source gun 74, a Ag source gun 75, and a Ga source gun 76 are accommodated in the vacuum chamber 71. The back pressure in the vacuum chamber 71 when the MBE apparatus is operating is $10^{-8}$ Pa-$10^{-2}$ Pa.

The Zn source gun 72, the Mg source gun 74, the Ag source gun 75, and the Ga source gun 76 respectively include Knudsen cells for accommodating solid state sources of Zn (7N), Mg (6N), Ag (6N), and Ga(7N), and eject Zn beam, Mg beam, Ag beam, and Ga beam when the cells are heated.

The O source gun 73 includes an electrodeless discharge tube which uses a radio frequency wave of, for example, 13.56 MHz, for producing plasma in the electrodeless discharge tube from $O_2$ (6N) gas, and ejecting O radical beam. The discharge tube may be formed of alumina, or high purity quartz.

A substrate 78 is held by a stage 77 having a substrate heater. The source guns 72 to 76 are respectively provided with cell shutters. States where the substrate 78 is directly irradiated by the respective beams and where it is not directly irradiated by the respective beams can be switched by the open/close conditions of the respective cell shutters. There is provided another shutter before the substrate 78. Desired beams can be irradiated on the substrate 78 at desired timings. The ZnO-containing compound semiconductor layer having desired composition can be grown.

A thickness gauge 79 for measuring a thickness of a film deposited on the substrate is disposed on a side of the stage 77 in the vacuum chamber 71. Sandwiching the stage 77, a RHEED gun 80 for emitting an electron beam and a screen 81 for receiving an electron beam reflected by the substrate 78 and displaying an image are disposed face to face.

Figure 1B:
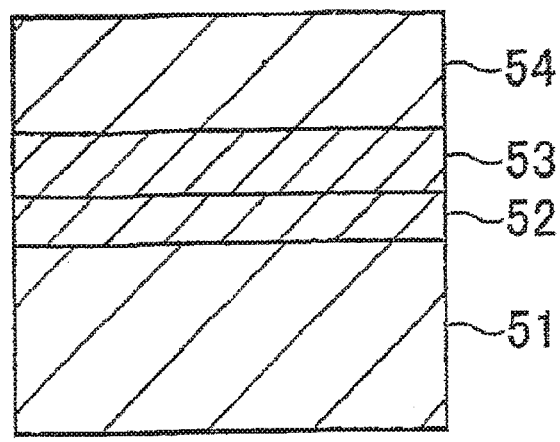

Referring to FIG. 1B, construction of sample will be described. On a Zn-face ZnO (0001) substrate 51 having n-type conductivity, a ZnO buffer layer 52, an undoped ZnO layer 53, and an alternate lamination layer 54 are formed by MBE, using the MBE apparatus illustrated in FIG. 1A.

Figure 1C:
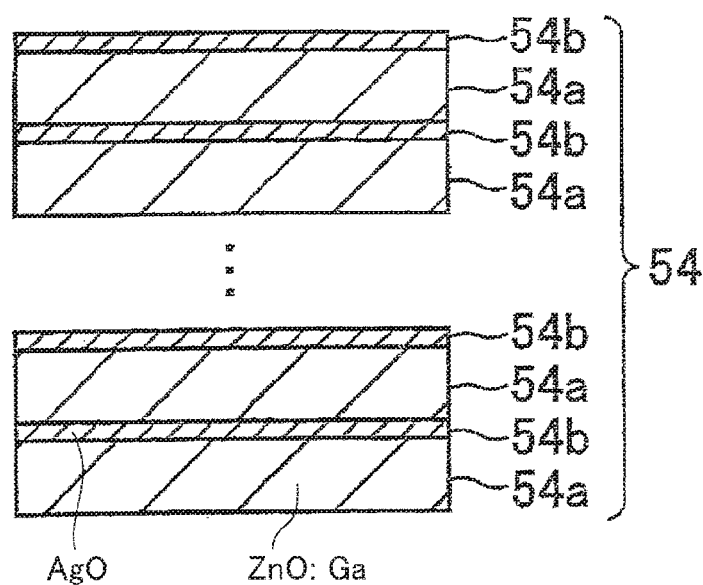

FIG. 1C is a partially enlarged cross section illustrating the structure of the alternate lamination 54. ZnO layers doped with Ga (ZnO:Ga layers) 54a and AgO layers 54b are alternately laminated to construct an alternate lamination 54, for example of 30 pairs. Here, "AgO" represents silver oxides which can be represented as $AgO_x$, such as AgO (silver oxide (II)), and $Ag_2O$ (silver oxide (I)). Processes for manufacturing samples will be described.

As illustrated in FIG. 2, thermal cleaning at 900° C. for 30 minutes is performed on the ZnO (0001) substrate 51, and then the temperature of the substrate 51 is lowered to 250° C. At a growth temperature of 250° C., a ZnO buffer layer 52 is grown on the ZnO substrate 51, under the condition of Zn flux $F_{Zn}$ of 0.14 nm/s ($J_{Zn}=9.2\times10^{14}$ atoms/cm$^2$s) and O radical beam irradiation under $O_2$ flow rate of 1.0 sccm, and RF power of 150 W ($J_O=1.0\times10^{15}$ atoms/cm$^2$s). VI/II flux ratio is about 1.09.

After the growth of the ZnO buffer layer 52, the temperature is raised to 950° C., and annealing is done for 30 minutes, for improving the crystallinity and surface flatness of the grown layer. After annealing, keeping 950° C., an undoped ZnO layer 53 is epitaxially grown on the ZnO buffer layer 52, under the condition of Zn flux $F_{Zn}$ of 0.14 nm/s, O radical beam irradiating conditions of RF power of 150 W, and $O_2$ flow rate of 1.0 sccm. The undoped ZnO layer 53 becomes n-type.

After the growth of the undoped ZnO layer 53, the substrate temperature is lowered and set at 250° C. On the undoped ZnO layer 53, an alternating lamination structure 54 of ZnO:Ga/AgO having a thickness of about 50 nm is formed. The ZnO:Ga layer 54a is formed for 10 seconds for each layer, under Zn flux $F_{Zn}$ of 0.14 nm/s, O radical beam irradiation conditions of RF power of 150 W and $O_2$ flow rate of 1.0 sccm, and Ga cell temperature $T_{Ga}$ of 550° C. ($F_{Ga}$ being below the detection lower limit). The AgO layer 54b is formed for 25 seconds for each layer with O radical beam irradiation condition of RF power 150 W, $O_2$ flow rate of 1.0 sccm, Ag cell temperature $T_{Ag}$ of 825° C. (Ag flux $F_{Ag}$ of 0.005 nm/s). The ZnO:Ga/AgO alternating lamination structure 54 exhibited n-type.

Then, composite anneal treatment is done on the alternating lamination structure 54. The composite anneal is performed in the MBE apparatus (atmosphere of a pressure below $10^{-2}$ Pa), following the growth of epitaxial layer, by intermittently irradiating oxygen radical beam. While the substrate is heated, the composite anneal is done at 810° C. for 20 minutes. In the composite annealing period, $O_2$ gas is excited in plasma state in electrodeless discharge tube (RF power of 300 W, and $O_2$ flow rate of 2.0 sccm).

Figure 3:
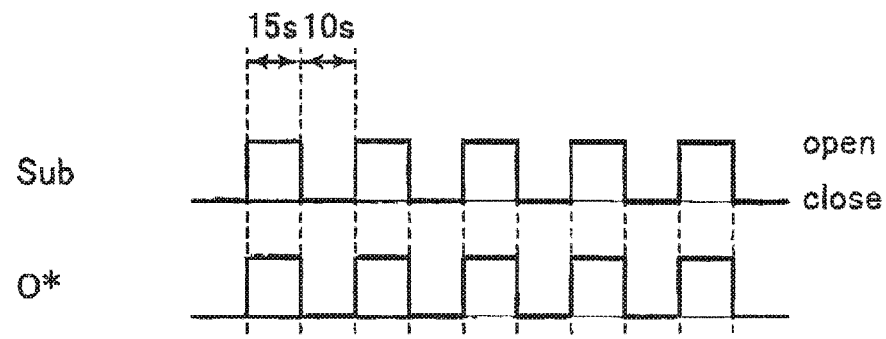
FIG. 3 is a timing chart illustrating an example of annealing under intermittent radiation of oxygen radical beam.

As illustrated in FIG. 3, in the composite annealing, oxygen radical beam irradiation presence periods, each of 15 seconds, in which the substrate shutter and O cell shutter are open, and oxygen radical beam irradiation absence periods, each of 10 seconds, in which the substrate shutter and O cell shutter are closed are alternately repeated.

Even the substrate shutter and the O cell shutter are closed, oxygen radicals of an amount corresponding to about ¼ in the shutter open state reach the substrate. In the atmosphere in which active oxygen exists and pressure is below $10^{-2}$ Pa, annealing which is considered to be able to move oxygen and Ag is done in time unit of seconds in the state in the absence of oxygen radical beam irradiation, and annealing which is considered to be able to suppress and annihilate oxygen vacancies is done in time unit of seconds in the state in which oxygen radical beam is irradiated on the semiconductor surface. Composite annealing is done for 20 minutes.

Figure 4:
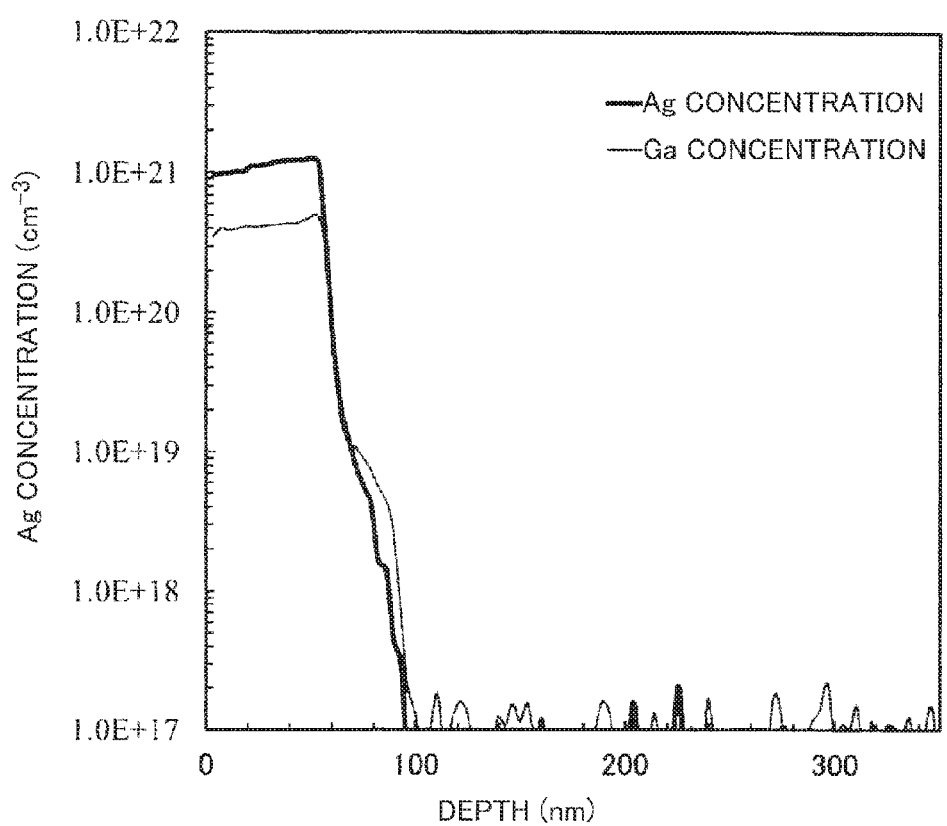
FIG. 4 is a graph illustrating example of depth profile of Ag concentration and Ga concentration in a sample made in the preceding research.

FIG. 4 illustrates an example of depth direction distributions of Ag concentration (cm$^{-3}$) and Ga concentration (cm$^{-3}$) measured in a sample after composite annealing, by secondary ion mass spectroscopy (SIMS). Ag and Ga are uniformly doped in a ZnO film by annealing. In the ZnO:(Ag+Ga) film, Ag concentration is about $1.2\times10^{21}$ cm$^{-3}$, and Ga concentration is about $4.2\times10^{20}$ cm$^{-3}$.

Figure 5:
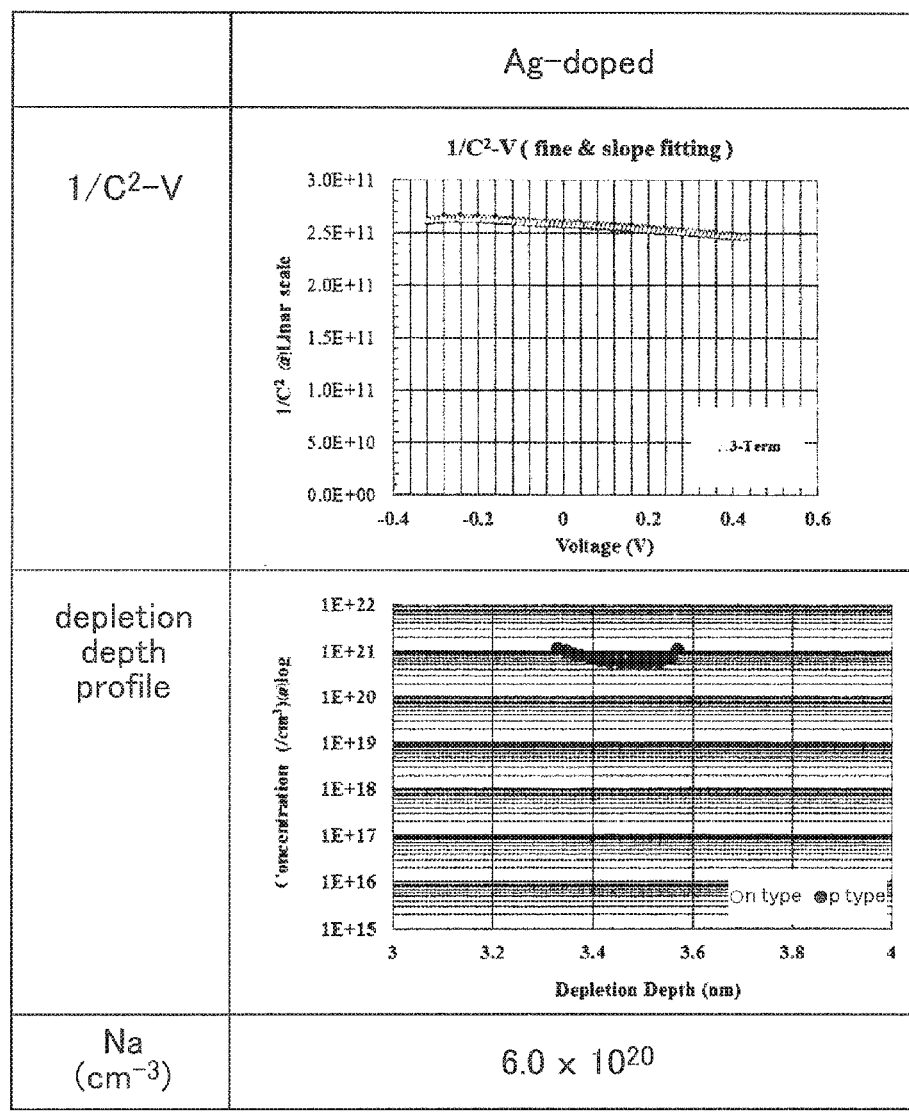
FIG. 5 is a graph illustrating $1/C^2$-V characteristics of the C-V measurement, and depth profile of impurity concentration, with the obtained acceptor concentration, measured on a sample made in the preceding research.

FIG. 5 indicates graphs illustrating $1/C^2$-V characteristics of C-V measurement and depth profile of impurity concentration for an example of the sample subjected to composite annealing. It is shown that the sample after the composite annealing obtains p-type. A high acceptor density of the order of $6.0\times10^{20}$ cm$^{-3}$, exceeding $10^{20}$ cm$^{-3}$ is obtained.

Raman scattering spectrum measurement was performed on the sample examples after performing composite annealing. The Raman spectrometer used was LabRAM HR-800 available from HORIBA JOBIN YVON. Excitation light was He-Ne laser (wavelength 632.8 nm). Measurement was done at room temperature in air atmosphere. Slit width was 100 nm, and detector was CCD.

Figure 6A:
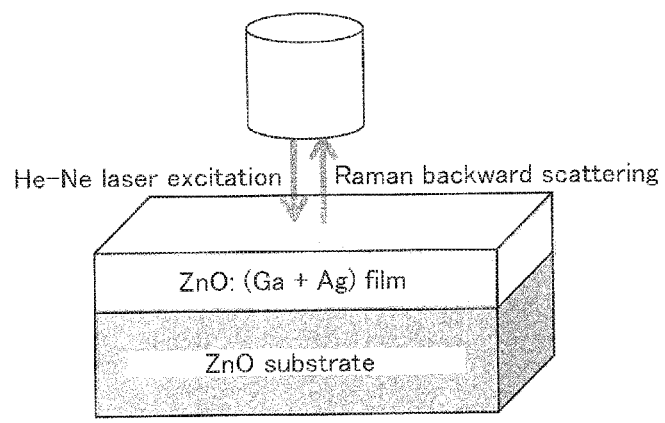
FIGS. 6A and 6B are schematic perspective view illustrating Raman scattering spectral measurement, and a graph of Raman scattering spectrum of a sample made in the preceding research.

FIG. 6A is a schematic perspective view illustrating structure of a sample. On a ZnO substrate, a ZnO: (Ga+Ag) film is formed. Excitation light from He-Ne laser is irradiated on the ZnO: (Ga+Ag) film, and Raman spectrum of backward scattering is measured.

Figure 6B:
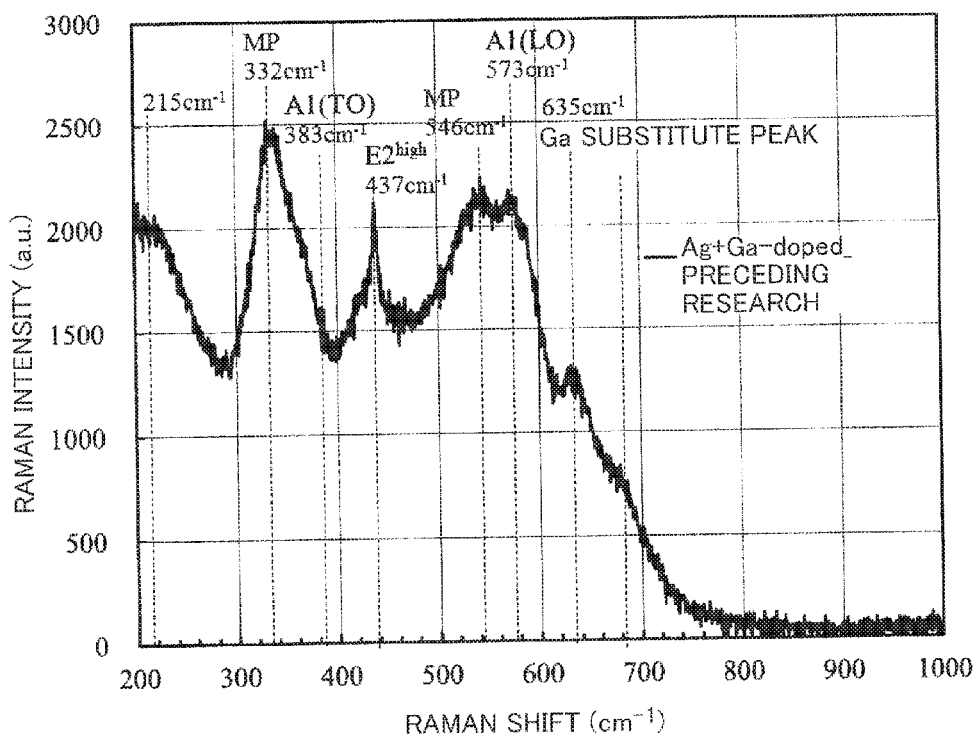

FIG. 6B is a graph illustrating obtained Raman spectrum. In this graph, a peak $E_2^{high}$ existing in the neighborhood of 437 cm$^{-1}$ is reported as a vibration mode of Zn in ZnO crystal, and a peak $A_1$(LO) existing in the neighborhood of 573 cm$^{-1}$ is reported as a vibration mode relating to oxygen vacancy or interstitial Zn (for example, see C. J. Youn et al.; J. Cryst. Growth, 261, 526 (2004)).

The peak $A_1$(LO) based on lattice defects shows a higher intensity than the peak $E_2^{high}$ which is based on the vibration of intrinsic ZnO crystal. The spectrum of this graph is one in which the peak $E_2^{high}$ appears most strongly and apparently. There are even those samples in which the peak $E_2^{high}$ can scarcely be observed. In the Raman spectra of ZnO: (Ga+Ag) films formed by the manufacturing method of the preceding research, the peak $A_1$(LO) showed stronger intensity than the peak $E_2^{high}$. It is considered that the spectra indicate that there are many lattice defects such as interstitial Zn and oxygen vacancy.

Figure 7A:
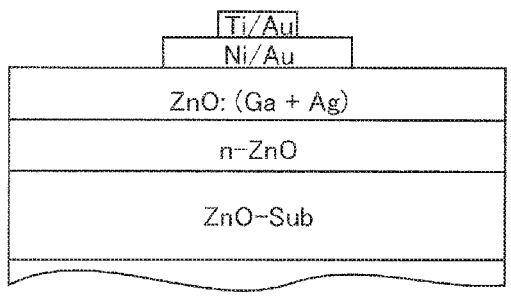
FIGS. 7A and 7B are a schematic sectional view of a light emitting diode sample made in the preceding research and a graph of I-V characteristics measured in the sample.

As illustrated in FIG. 7A, a diode sample was prepared in which a ZnO: (Ga+Ag) film according to the preceding research is formed on an n-type ZnO-containing semiconductor layer which is formed on a ZnO substrate, forming a light emitting diode structure. Transparent electrode formed of lamination of Ni(0.2 nm)/Au(10 nm) in a shape of 280 µm square is formed on the ZnO: (Ga+Ag) film, and a bonding electrode formed of lamination of Ti(25 nm)/Au(260 nm) in a shape of 100 µm diameter is formed on a central position. An n-side electrode is formed on the rear surface of the substrate.

Figure 7B:
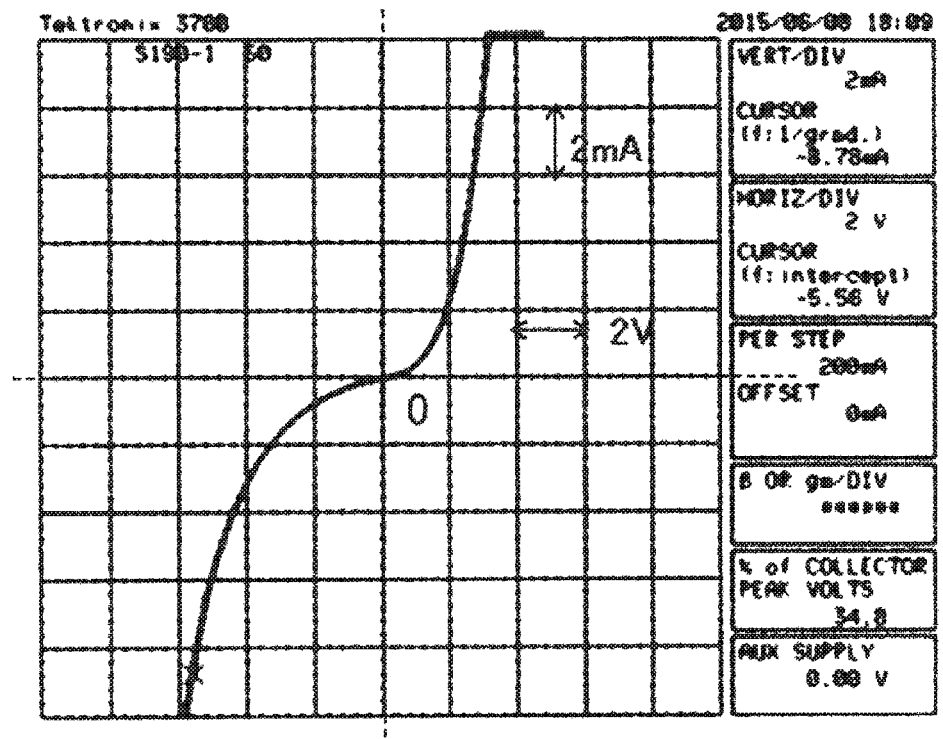

FIG. 7B is a graph illustrating I-V characteristics measured on the above-described sample. Although a diode-like shape is seen, leak current is high, and the forward current is allowed to flow below a forward voltage less than 1 V. There is shown almost no reverse breakdown voltage.

In the samples according to the preceding research, Ag and Ga uniformly exist in the film, and p-type films having acceptor density larger than or equal to $1 \times 10^{20}$ cm$^{-3}$ are obtained. The experimental data shown in FIGS. 6B and 7B indicate that the crystal quality of p-type ZnO-containing semiconductor layers is considerably inferior. It will be difficult to make semiconductor devices of superior characteristics using such semiconductor layer. By performing anneal treatment for effectively substituting Ag at Zn sites, a great deal of oxygen vacancies etc. are generated, I-V curve of the LED structure shows characteristics of very high leak, and the devices have poor current injection efficiency into an active layer.

In the manufacturing process of the preceding research, thermal treatment in a temperature range between 750° C. and 950° C., for a period between 10 minutes and 30 minutes is performed to form Zn vacancies, accelerate diffusion of Ag and improve the replacement efficiency of Ag, thereby diffusing and replacing Ag. By this anneal treatment, the replacement efficiency of Ag increases, but defects such as oxygen vacancies and interstitial Zn may be generated. It is considered that mainly due to the increase of this n-type defects such as oxygen vacancies and interstitial Zn, devices having high leak current will be formed.

The present inventors have considered how to reduce oxygen vacancies to form p-type ZnO-containing semiconductor layer having good crystallinity. The present inventors have thought of dividing ZnO:Ga layer in the alternate lamination of ZnO:Ga layers and AgO layers according to the preceding research, into a plurality of layers, and forming an active oxygen (O*) layer at each interface of thinned ZnO:Ga layers. It may be called double lamination structure, including alternate lamination of ZnO;Ga layers and O* layers, in the alternate lamination of ZnO:Ga layers and AgO layers. The alternate lamination of ZnO;Ga layers and O* layers may be called subsidiary lamination. It is considered that this structure can supply necessary oxygen to ZnO:Ga layers from adjacent active oxygen (O*) layers.

As illustrated in FIG. 8A, a subsidiary lamination 22A is formed on an underlie 21, by alternately forming active oxygen (O*) layers 22a and thinned ZnO:Ga layers 22b. The subsidiary lamination 22A corresponds to one layer of Ga doped ZnO semiconductor layer 54a of the preceding research, but it is divided into a plurality of thin layers by the O* layers 22a. The O* layers are newly added components.

As illustrated in FIG. 8B, on a subsidiary lamination 22A, an O* layer 22C is formed, and an AgO layer 22p is formed thereon. This lamination structure of subsidiary lamination 22A/O* layer 22C/AgO layer 22p is repeatedly laminated, to form double lamination structure 22 for forming a p-type layer. Lamination of O* layer 22C/AgO layer 22p may be called as p-type impurity supplying layer. The ZnO-containing semiconductor double lamination structure 22 co-doped with (Ga+Ag) before annealing has n-type. Here, active oxygen layer exists at each interface of the lamination structure.

Representation of FIG. 8C represents a structure in which O* layers and ZnO:Ga layers are alternately laminated for 3 periods to form a subsidiary lamination, and an O* layer and an AgO layer are laminated thereon. O* layers are sandwiched between adjacent ones of plurality of ZnO:Ga layers. As an example of timing chart, formation of O* layer is done for 5 seconds, formation of ZnO:Ga layer is done for 3 seconds, and formation of AgO layer is done for 25 seconds. Letting this serial lamination as 1 set, a lamination having a thickness of about 1.6 nm is to be formed. Repeating growth by 30 sets, lamination having a thickness of about 50 nm as a whole is formed.

The ZnO:Ga layer in one set may be divided in 2-divisions, 3-divisions, 5-divisions, and 10 divisions, reducing the thickness of unit ZnO:Ga layer 22b to 0.8 nm, 0.5 nm, 0.32 nm, and 0.16 nm. Effect of inserted O* layer may be estimated from the change observed when the total thickness of ZnO:Ga layer in one set is fixed, and the number of division is increased (the thickness of unit ZnO:Ga layer 22b is reduced).

Manufacturing conditions are as follows. $F_{Zn}$=0.14 nm/sec, ($J_{Zn}$=9.2×10$^{14}$ atoms/cm$^2$sec), $O_2$=1 sccm/RF=150 W ($J_O$=1.0×10$^{15}$ atoms/cm$^2$sec), VI/II flux ratio: 1.09, $T_{Ga}$=550° C. ($F_{Ga}$ below lower detection limit), $T_{Ag}$=840° C. ($F_{Ag}$=0.005 nm/sec).

FIG. 8D is a graph representing temperature profile of sample manufacture process, and contents of the process. It corresponds to temperature process of FIG. 2 related with the preceding research. First thermal cleaning is done at 900° C., and the temperature is lowered to 250° C. to grow a buffer layer, then the temperature is raised to 950° C., annealing the buffer layer and then to grow an undoped ZnO layer on the buffer layer. Then the temperature is lowered to 250° C., to grow in step 1, MgZnO-containing semiconductor double laminated structure in which subsidiary lamination of ZnO:Ga layers and O* layers, and AgO layers are laminated sandwiching O* layers, as shown in FIGS. 8A-8C. Composition of MgZnO, when represented as $Mg_xZn_{1-x}O$, is (0≤x≤0.6). After the growth, the substrate temperature is raised to 810° C. in step 2. When the substrate temperature reaches 810° C., in-situ annealing is done for 30 minutes in an atmosphere in which active oxygen O* exists and pressure is below 10$^{-2}$ Pa. This annealing is composite annealing in which periods with presence of irradiation of active oxygen and periods in the absence of irradiation of active oxygen are alternately repeated.

Figure 9A:
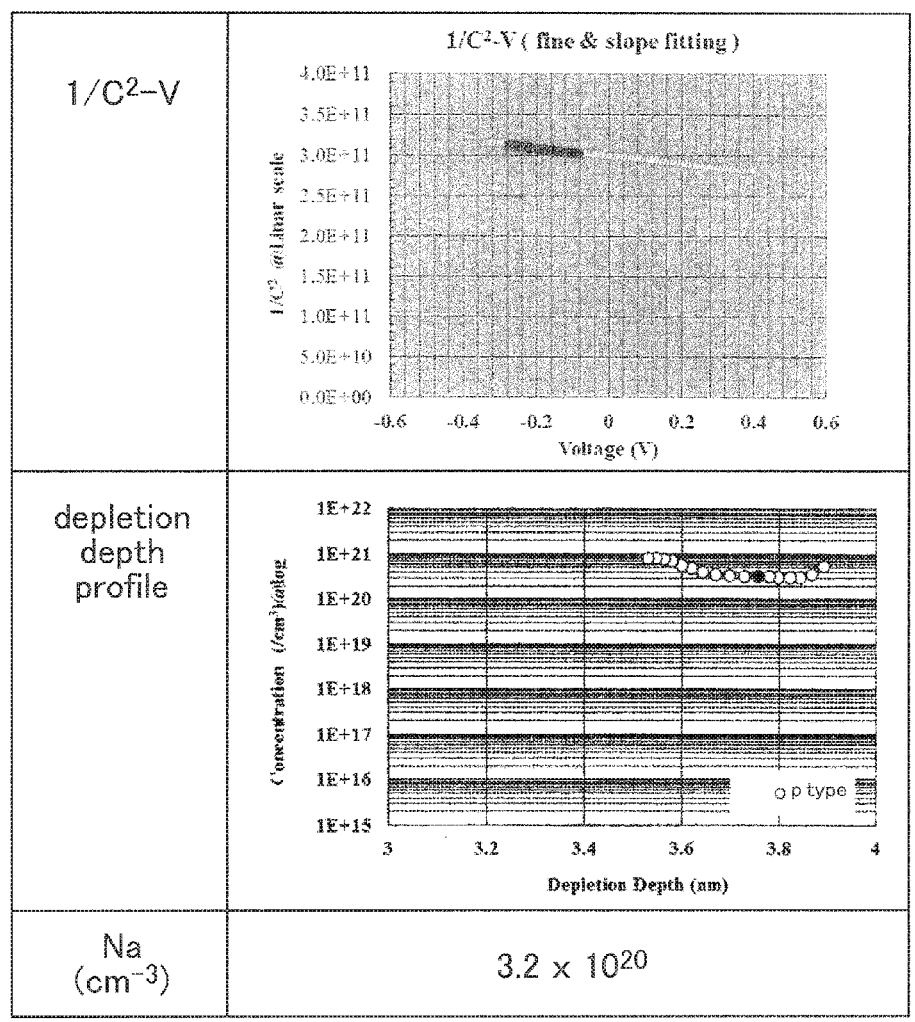
FIGS. 9A and 9B are graphs illustrating $1/C^2$-V characteristics of the C-V measurement, and depth profile of impurity concentration, with the obtained acceptor concentration, measured on two samples made according to the embodiment.
Figure 9B:
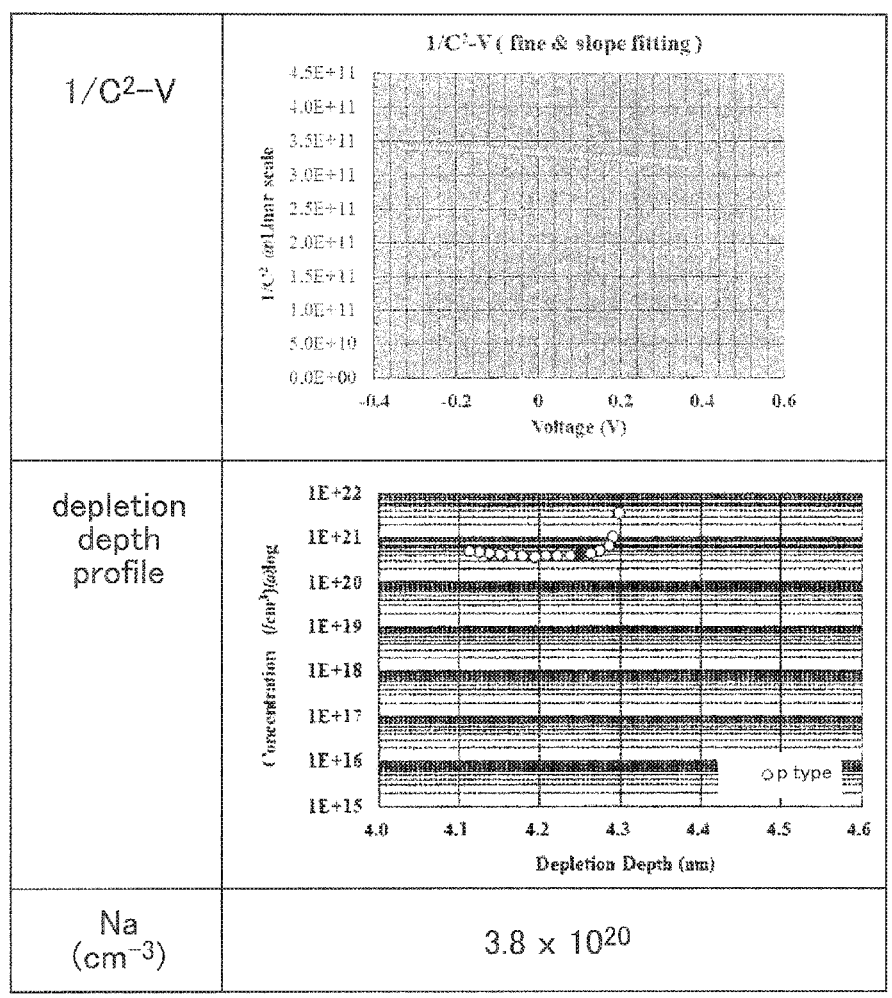

FIGS. 9A and 9B are graphs illustrating 1/C$^2$-V characteristics of C-V measurement and depth profile of impurity concentration for examples of the samples in which the thickness of the unit ZnO:Ga layer 22b is 0.5 nm and 0.16 nm. P-type conductivity is obtained and acceptor densities of 3.2×10$^{20}$ and 3.8×10$^{20}$ are obtained. Even when the thickness of the unit ZnO:Ga layer 22b is reduced, p-type conductivity is obtained.

Figure 10:
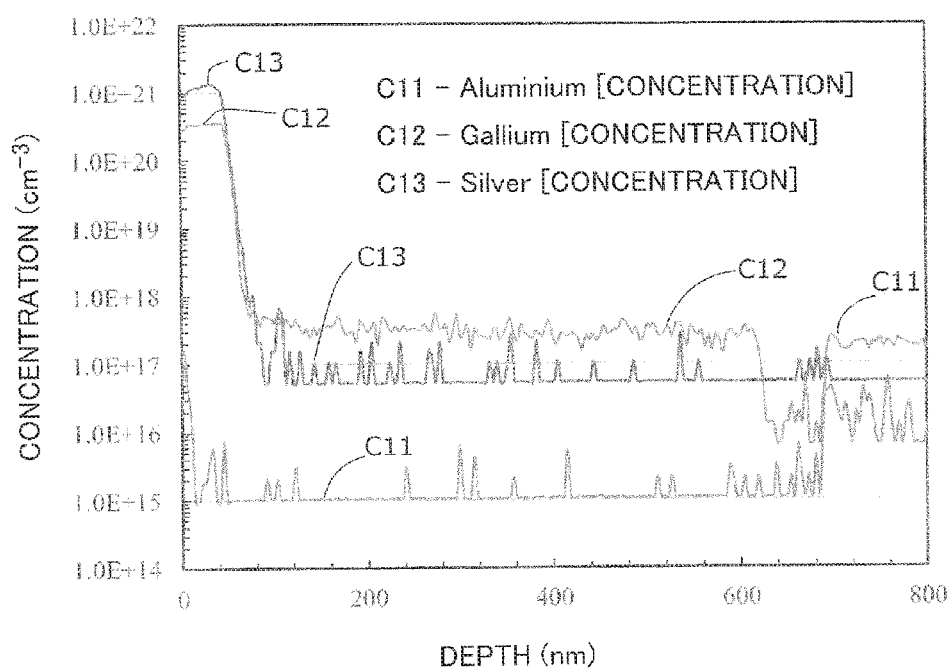
FIG. 10 is a graph illustrating Ga and Ag concentrations in a sample according to the embodiment together with Al concentration in the substrate composition, obtained by SIMS measurement.

FIG. 10 is a graph illustrating composition distribution by SIMS analysis in the depth direction of a sample formed on an Al-doped n-type ZnO substrate. The abscissa represents depth in the unit of nm, and the ordinate represents concentration in the unit of cm$^{-3}$. The position where Al concentration rapidly drops is the surface of the Al-doped substrate. In the (Ag+Ga) doped layer on the underlie, Ag is uniformly doped in the film. In the (Ag+Ga) doped layer, the Ag concentration C13 is about $1.2 \times 10^{21}$ cm$^{-3}$, while Ga concentration C12 is about $3.5 \times 10^{20}$ cm$^{-3}$.

Figure 11:
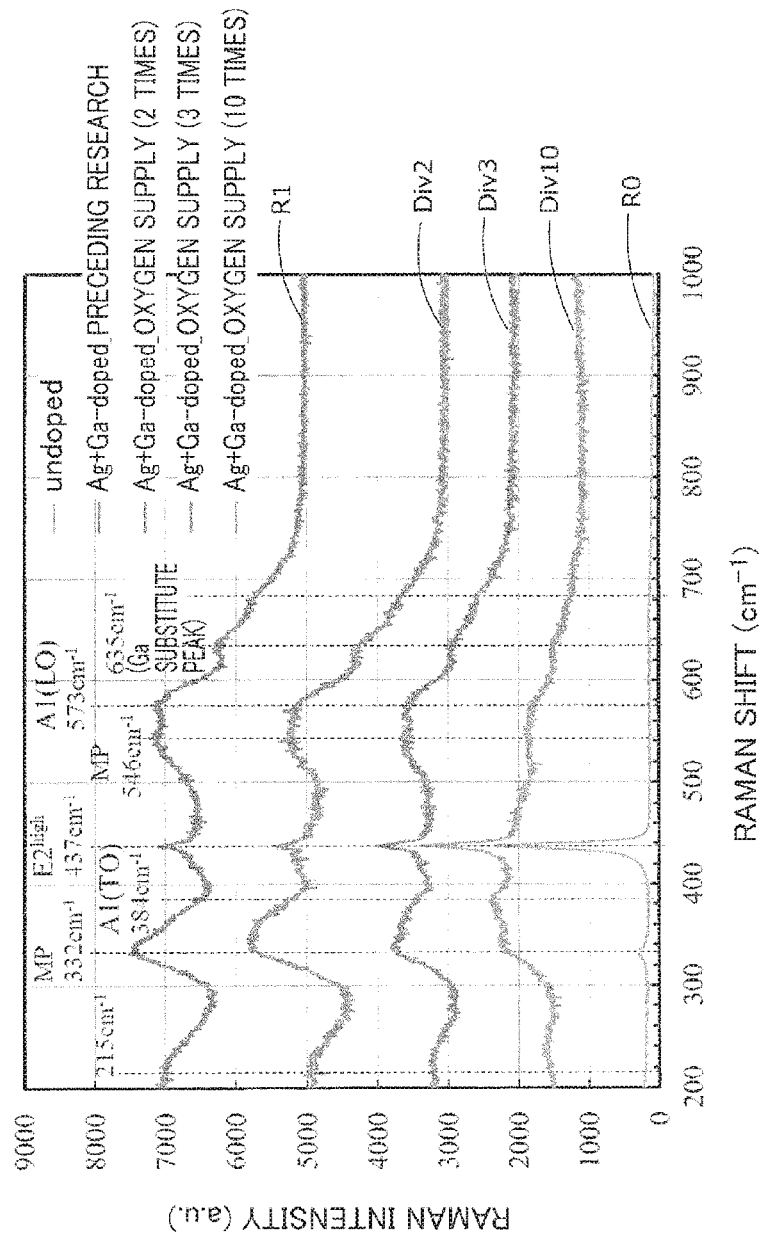
FIG. 11 is a graph illustrating results of Raman scattering spectral measurement on three kinds of samples according to the embodiment, together with results of Raman scattering spectral measurement on comparison examples.

FIG. 11 is a graph illustrating the results of Raman scattering measurements for samples according to the embodiment. Raman scattering spectra of samples Div2, Div3, and Div10 in which the ZnO:Ga layer is divided into two, three, and ten slices are shown, together with Raman scattering spectra of comparison examples of sample R0 of non-doped ZnO layer, and sample R1 of the preceding research. The abscissa represents Raman shift in the unit of cm$^{-1}$, and the ordinate represents Raman scattering intensity in arbitrary unit.

Spectrum of comparison example R0 is Raman scattering spectrum of ZnO of high crystallinity, not-doped with impurity. A sharp $E_2^{high}$ peak ascribed to ZnO crystal is observed. In the Raman scattering spectrum of comparison example R1, the $E_2^{high}$ peak ascribed to ZnO crystal shows only an intensity less than the intensity of $A_1$(LO) peak ascribed to n-type deficiencies such as interstitial Zn and oxygen vacancy.

In the Raman scattering spectra of the samples Div2, Div3, and Div10 according to the embodiment, it appears that in accordance with increase in the number of division (2, 3, 10), the $E_2^{high}$ peak becomes stronger, and the $A_1$(LO) peak becomes weak. It is apparent that the intensity of the $A_1$(LO) peak based on the n-type deficiencies such as interstitial Zn and oxygen vacancy is below the intensity of the $E_2^{high}$ peak based on the ZnO crystal. It can be considered that dividing the ZnO:Ga layer and disposing an O* layer at each interface, high crystallinity can be obtained.

Figure 12A:
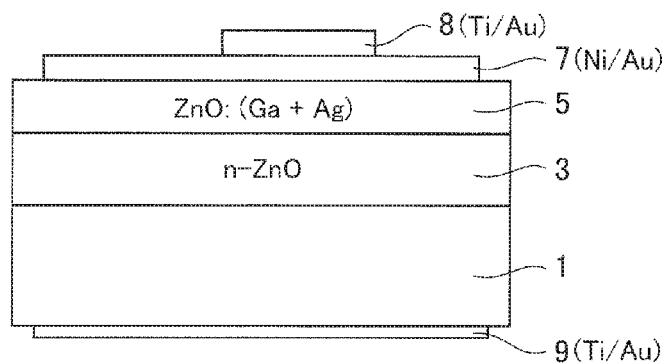
FIGS. 12A and 12B are a schematic sectional view of a light emitting diode sample using a p-type ZnO-containing semiconductor layer according to the embodiment, and a graph of I-V characteristics measured on the sample.

FIG. 12A is a schematic cross section of an LED structure made by using a p-type ZnO-containing semiconductor layer according to the embodiment. As illustrated in FIG. 12A, the structure of the device used in the measurement is a light emitting diode structure in which a ZnO: (Ga+Ag) film 5 according to the embodiment is formed on an n-type ZnO-containing semiconductor layer 3 formed on a ZnO substrate 1. Ni(0.2 nm)/Au(10 nm) lamination 7 is formed in 280 nm square as a transparent electrode, Ti(25 nm)/Au(260 nm) lamination 8 is formed on transparent electrode 7 at a central portion thereof in 100 nm diameter as a bonding electrode, and Ni(1 nm)/Au(10 nm) lamination 9 is formed on the rear surface of the ZnO substrate as n-side electrode.

Figure 12B:
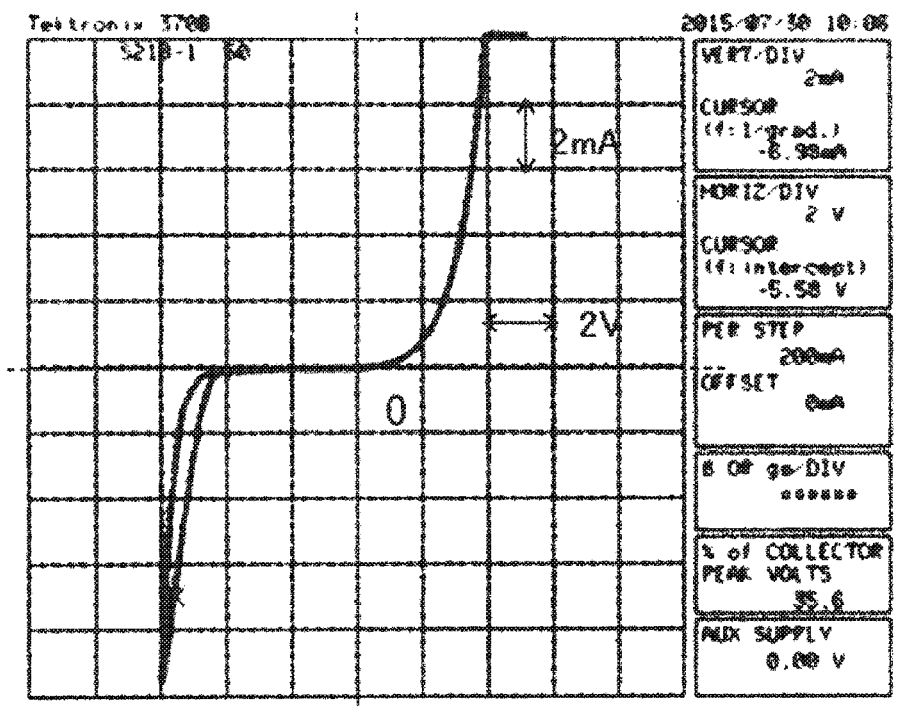

FIG. 12B is a graph illustrating I-V characteristics measured in the LED sample. Compared with the I-V characteristics of the preceding research LED as illustrated in FIG. 7, it is recognized that the leak current is largely decreased, apparent threshold voltage 3.4 V is recognized, and the reverse breakdown voltage is widely improved. It is considered that these data indicate decrease of the n-type deficiencies such as oxygen vacancy and the interstitial Zn.

Although the number of division of the ZnO:Ga layer was set to 2, 3, 5 and 10 in the above description, the number of division may be 2 or larger. In a contiguous lamination, there may be formed portions of different number of division. Regarding the thickness of the divided unit layer, good results are obtained even when the unit layer was thinned up to 0.16 nm. The thickness of the divided unit layer would preferably from 0.15 nm to 0.8 nm. Similar results will be obtained even when the ZnO:Ga layer is changed to MgZnO:Ga layer.

Although crystal growth was done by MBE, it would also be possible to use such growth methods as metal organic chemical vapor deposition (MOCVD), pulse laser deposition (PLD), etc. Ga was used as n-type impurity. Substantially similar results will be expected for using group 3B elements B, Al, Ga, and In. The p-type impurity to be used is only Ag.

Although composite annealing was done at 810° C., as the annealing temperature which enables movement of constituent elements of ZnO, 750° C. to 950° C. may be used. Although the period of without oxygen radical irradiation and the period with oxygen radical irradiation were set at 10 seconds and 15 seconds, these periods are not limitative, and can be varied in various way. Possible examples of the period of without oxygen radical irradiation and the period with oxygen radical irradiation may be (10 s, 10 s), (10 s, 15 s), (10 s, 20 s), (10 s, 30 s) etc.

Semiconductor light emitting devices can be made by using the above-described p-type ZnO-containing semiconductor layer. A ZnO-containing semiconductor layer including n-type impurity such as Ga, and Ag as p-type impurity can be formed by the structure and process as illustrated in FIGS. 8A-8D.

Figure 13A:
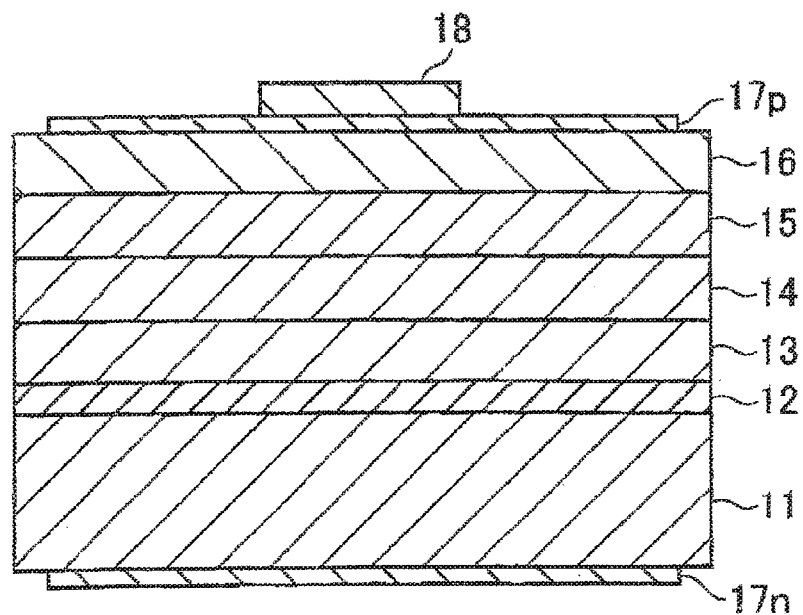
FIGS. 13A and 13B are a schematic cross sectional view of a ZnO-containing semiconductor light emitting element made by manufacturing method according to the embodiment, and a schematic cross section of another structure of an active layer 15.

FIG. 13A is a schematic cross section of a ZnO-containing semiconductor light emitting device to be manufactured. A ZnO buffer layer 12, for example of a thickness of 30 nm is formed on a ZnO substrate 11. Annealing is done for improving crystal quality and surface flatness of the ZnO buffer layer 12.

On the ZnO buffer layer 12, an n-type ZnO layer 13, for example of a thickness 150 nm, is grown. The Ga concentration of the n-type ZnO layer 13 is, for example about $1.5 \times 10^{18}$ cm$^{-3}$. On the n-type ZnO layer 13, an n-type MgZnO layer 14, for example of a thickness of about 30 nm, is grown. The Mg composition of the n-type MgZnO layer 14 is for example about 0.3. On the n-type MgZnO layer 14, a ZnO active layer 15, for example of a thickness of 10 nm, is grown. On the ZnO active layer 15, a double lamination structure as shown in FIG. 8A including subsidiary lamination of O* layers and MgZnO:Ga layers, and alternate lamination of subsidiary lamination and AgO layers sandwiching O* layers as shown in FIG. 8B is formed. The double lamination structure initially presents n-type. Composite annealing as described above is performed on the double lamination structure to form p-type MgZnO layer 16 co-doped with Ag and Ga.

Figure 13B:
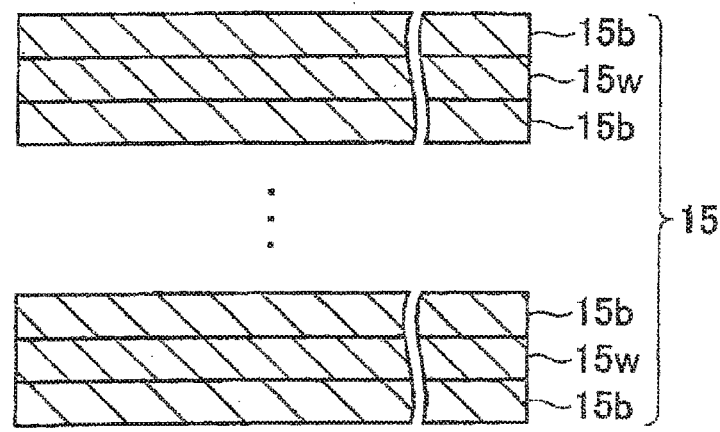

As illustrated in FIG. 13B, an active layer 15 may be formed of quantum well structure including alternate lamination of MgZnO barrier layers 15b and ZnO well layers 15w, in place of a single ZnO layer.

On the rear surface of the ZnO substrate 11, an n-side electrode 17n is formed, and a p-side electrode 17p is formed on the p-type MgZnO layer 16 co-doped with Ag and Ga. On the p-side electrode 17p, a bonding electrode 18 is formed. For example, the n-side electrode 17n is formed by laminating a Ti layer and a Au layer thereon, the p-side electrode 17p is formed by laminating a Ni layer and a Au layer thereon. The bonding electrode may be formed of a Au layer. A ZnO-containing semiconductor light emitting device is formed in this way.

Although a ZnO substrate 11 was used in the above description, it is possible to use a conductive substrate such as MgZnO substrate, GaN substrate, SiC substrate, Ga$_2$O$_3$ substrate, etc. It will be apparent to those skilled in the art that various changes, improvements, combinations, etc. are possible. External electric furnace for achieving annealing is not necessary. Time for manufacturing a semiconductor light emitting device can be shortened.

The p-type ZnO-containing semiconductor layer to be formed by the embodiment can be used for manufacturing light emitting diodes, laser diodes, etc. and can be used in applications of these devices, and also in white LED and its applications, and UV sensors, etc.

What are claimed are:

1. A ZnO-containing semiconductor structure comprising:
   ZnO-containing semiconductor co-doped with impurities including Ag and at least one species of group 3B element;
   wherein the ZnO-containing semiconductor generates in a Raman scattering spectrum an $A_1$ (LO) mode signal having an intensity lower than an intensity of an $E_2^{high}$ mode signal.

2. The ZnO-containing semiconductor structure according to claim 1, wherein the ZnO-containing semiconductor has p-type.

3. The ZnO-containing semiconductor structure according to claim 2, wherein there are impurity atoms Ag occupying Zn-sites.

4. The ZnO-containing semiconductor structure according to claim 3, wherein said group 3B element is at least one of B, Al, Ga, and In.

5. The ZnO-containing semiconductor structure according to claim 4, wherein said group 3B element is Ga.

6. A ZnO-containing semiconductor structure comprising:
   a semiconductor substrate;
   an n-type ZnO-containing semiconductor layer formed on the semiconductor substrate;
   a ZnO-containing semiconductor light emitting layer formed on said n-type ZnO-containing semiconductor layer; and
   a p-type ZnO-containing semiconductor layer including ZnO-containing semiconductor co-doped with impurities including Ag and at least one species of group 3B element, wherein the ZnO-containing semiconductor generates in a Raman scattering spectrum an $A_1(LO)$ mode signal having an intensity lower than an intensity of an $E_2^{high}$ mode signal.

7. The ZnO-containing semiconductor structure according to claim 6, wherein said ZnO-containing semiconductor light emitting layer produces emission of lights in a wavelength range from ultraviolet to blue light.

8. The ZnO-containing semiconductor structure according to claim 6, wherein said semiconductor substrate includes at least one selected from the group consisting of ZnO, MgZnO, GaN, SiC, and $Ga_2O_3$.

9. A method of manufacturing the ZnO-containing semiconductor structure according to claim 1, the method comprising the steps of:
   (a) forming a subsidiary lamination, including alternately laminating at least two periods of active oxygen layers and ZnO-containing semiconductor layers doped with at least one species of group 3B element;
   (b) alternately laminating said subsidiary lamination and an AgO layer, sandwiching an active oxygen layer, to form a lamination structure; and
   (c) carrying out annealing in an atmosphere in which active oxygen exists and pressure is below $10^{-2}$ Pa, while intermittently irradiating an oxygen radical beam on a surface of said lamination structure, to form said ZnO-containing semiconductor co-doped with said group 3B element and Ag, said ZnO-containing semiconductor having p-type.

10. The method according to claim 9, wherein said step (b) includes forming said active oxygen layer at an interface between one of said ZnO-containing semiconductor layers and said AgO layer.

11. The method according to claim 9, wherein each of said ZnO-containing semiconductor layers has a thickness for each layer in a range from 0.15 nm to 0.8 nm.

12. The method according to claim 9, wherein said steps (a) and (b) are done by molecular beam epitaxy.

13. The method according to claim 12, wherein said steps (a), (b), and (c) are done in a same MBE apparatus, and said step (c) is done at a substrate temperature in a range of 750° C. to 950° C.

14. The method according to claim 13, further comprising the step of:
   (x) before said step (a), loading a ZnO-containing semiconductor substrate in said MBE apparatus, forming an n-type ZnO-containing semiconductor layer above said ZnO-containing semiconductor substrate, and forming a light emitting layer of ZnO-containing semiconductor.

15. A method of manufacturing the ZnO-containing semiconductor structure according to claim 6, the method comprising the steps of:
   (a) loading a ZnO-containing semiconductor substrate, as said semiconductor substrate, in a MBE apparatus,
   (b) forming said n-type ZnO-containing semiconductor layer above said ZnO-containing conductor substrate;
   (c) forming said light emitting layer of ZnO-containing semiconductor;
   (d) forming a subsidiary lamination, including alternately laminating at least two periods of active oxygen layers and ZnO-containing semiconductor layers doped with at least one species of group 3B element;
   (e) alternately laminating said subsidiary lamination and an AgO layer, sandwiching an active oxygen layer, to form a lamination structure; and
   (f) carrying out annealing in an atmosphere in which active oxygen exists and pressure is below $10^{-2}$ Pa, while intermittently irradiating an oxygen radical beam on a surface of said lamination structure, to form said p-type ZnO-containing semiconductor layer including said ZnO-containing semiconductor co-doped with said group 3B element and Ag.

16. The method according to claim 15, further comprising the steps of:
   (g) forming a p-side electrode on a front surface of said p-type ZnO-containing semiconductor layer; and
   (h) forming a n-side electrode on a rear surface of said n-type ZnO-containing semiconductor layer.

* * * * *